United States Patent
Hanson et al.

(10) Patent No.: US 9,876,082 B2
(45) Date of Patent: Jan. 23, 2018

(54) TRANSISTOR WITH HOLE BARRIER LAYER

(71) Applicant: MACOM Technology Solutions Holdings, Inc., Lowell, MA (US)

(72) Inventors: Allen W. Hanson, Cary, NC (US); Gabriel R. Cueva, Bedford, NH (US); Wayne M. Struble, Franklin, MA (US); Yan Zhang, Groton, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 265 days.

(21) Appl. No.: 14/700,712

(22) Filed: Apr. 30, 2015

(65) Prior Publication Data
US 2016/0322457 A1 Nov. 3, 2016

(51) Int. Cl.
*H01L 29/205* (2006.01)
*H01L 29/66* (2006.01)
*H01L 29/43* (2006.01)
*H01L 29/778* (2006.01)

(52) U.S. Cl.
CPC .......... *H01L 29/205* (2013.01); *H01L 29/432* (2013.01); *H01L 29/66462* (2013.01); *H01L 29/7784* (2013.01); *H01L 29/7785* (2013.01)

(58) Field of Classification Search
CPC ............. H01L 29/205; H01L 29/432; H01L 29/66462; H01L 29/7784; H01L 29/7785
See application file for complete search history.

(56) References Cited

U.S. PATENT DOCUMENTS

| 5,140,386 | A | 8/1992 | Huang et al. .................. 357/22 |
| 6,307,221 | B1 * | 10/2001 | Danzilio ........... H01L 29/66462 257/192 |
| 6,573,129 | B2 | 6/2003 | Hoke et al. .................... 438/167 |
| 6,670,652 | B2 * | 12/2003 | Song .................. H01L 27/0605 257/11 |
| 6,797,994 | B1 * | 9/2004 | Hoke ............... H01L 21/28587 257/192 |
| 2007/0018199 | A1 | 1/2007 | Sheppard et al. ............ 257/200 |
| 2007/0120186 | A1 | 5/2007 | Lu et al. ....................... 257/345 |

(Continued)

OTHER PUBLICATIONS

Matthews, J. W. et al., "Use of Misfit Strain to Remove Dislocations from Epitaxial Thin Films", Thin Solid Films, 33, 1976, pp. 253-266.

(Continued)

*Primary Examiner* — Bilkis Jahan
*Assistant Examiner* — Victor Barzykin
(74) *Attorney, Agent, or Firm* — Christopher P. Maiorana, PC

(57) ABSTRACT

An apparatus includes a channel layer, a first layer, a hole barrier layer and a second layer. The channel layer may be configured to carry a drain current in response to a voltage at a gate node. The first layer may be between the channel layer and the gate node. The first layer generally has a first bandgap. The hole barrier layer may be in contact with the first layer. The hole barrier layer generally has a second bandgap that (i) forms a valence band offset relative to the first bandgap and (ii) is configured to impede holes generated in one or more of the channel layer and the first layer from reaching the gate node. The gate node may be in contact with the second layer. The apparatus generally forms a field effect transistor.

20 Claims, 6 Drawing Sheets

(56) References Cited

U.S. PATENT DOCUMENTS

| | | | |
|---|---|---|---|
| 2011/0001166 A1 | 1/2011 | Ogura | 257/187 |
| 2011/0049471 A1 | 3/2011 | Johnson | 257/13 |
| 2013/0075751 A1* | 3/2013 | Imanishi | H01L 29/66462 257/76 |
| 2015/0008420 A1 | 1/2015 | Mazhari et al. | 257/40 |

OTHER PUBLICATIONS

Heedt, C. et al., "Drastic Reduction of Gate Leakage in InAlAs/ InGaAs HEMT's Using a Pseudomorphic InAlAs Hole Barrier Layer", IEEE Transactions on Electron Devices, Oct. 1994.

Tkachenko, Y. et al., "E-PHEMT for Single Supply, No Drain Switch, and High Efficiency Cellular Telephone Power Amplifiers", GaAs IC Symposium, 1999, pp. 127-130.

Danneville, F. et al., "Noise Performance of MESFETs and MODFETs: Influence of the Gate Leakage Current", Solid State Device Research Conference, IEEE, 1993, pp. 47-50.

* cited by examiner

TRANSISTOR WITH HOLE BARRIER LAYER

FIELD OF THE INVENTION

The present invention relates to semiconductor devices generally and, more particularly, to a method and/or apparatus for implementing a transistor with a hole barrier layer.

BACKGROUND OF THE INVENTION

Yields, performances and reliability of Gallium Arsenide pseudomorphic high electron mobility transistor-based devices are limited by inconsistencies, gate leakage current levels and breakdown voltages. A conventional method to improve the variations, the leakage current levels and the breakdown voltages is to increase ungated recess dimensions about gate nodes of the devices. However, the increased ungated recess dimensions result in reduced performances, in particular, reduced gains and reduced efficiencies. Conventional double ungated recess dimensions further increase costs due to process complexity.

It would be desirable to implement a transistor with a hole barrier layer.

SUMMARY OF THE INVENTION

The present invention concerns an apparatus comprising a channel layer, a first layer, a hole barrier layer and a second layer. The channel layer may be configured to carry a drain current in response to a voltage at a gate node. The first layer may be between the channel layer and the gate node. The first layer generally has a first bandgap. The hole barrier layer may be in contact with the first layer. The hole barrier layer generally has a second bandgap that (i) forms a valence band offset relative to the first bandgap and (ii) is configured to impede holes generated in one or more of the channel layer and the first layer from reaching the gate node. The second layer may be in contact with the hole barrier layer. The gate node may be in contact with the second layer. The apparatus generally comprises a field effect transistor.

The objects, features and advantages of the present invention include providing a transistor with a hole barrier layer that may (i) improve yields over conventional designs, (ii) improve performances over conventional designs, (iii) improve reliability over conventional designs, (iv) add little cost to fabrication of an epitaxial material and/or (v) control dimensions by precise epitaxial growth rather than by less controllable processing steps.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Embodiments of the invention may incorporate an III-V semiconductor layer into an epitaxial structure of a transistor (e.g., a field effect transistor). The III-V semiconductor layer may reside within a barrier layer below a gate (e.g., Schottky contact) node. The III-V semiconductor layer generally suppresses a collection of extraneous holes by the gate node (or electrode) and/or one or more regions adjacent to the gate node. In normal situations, the extraneous holes may be generated by impact ionization and/or band-to-band tunneling.

Figure 1:
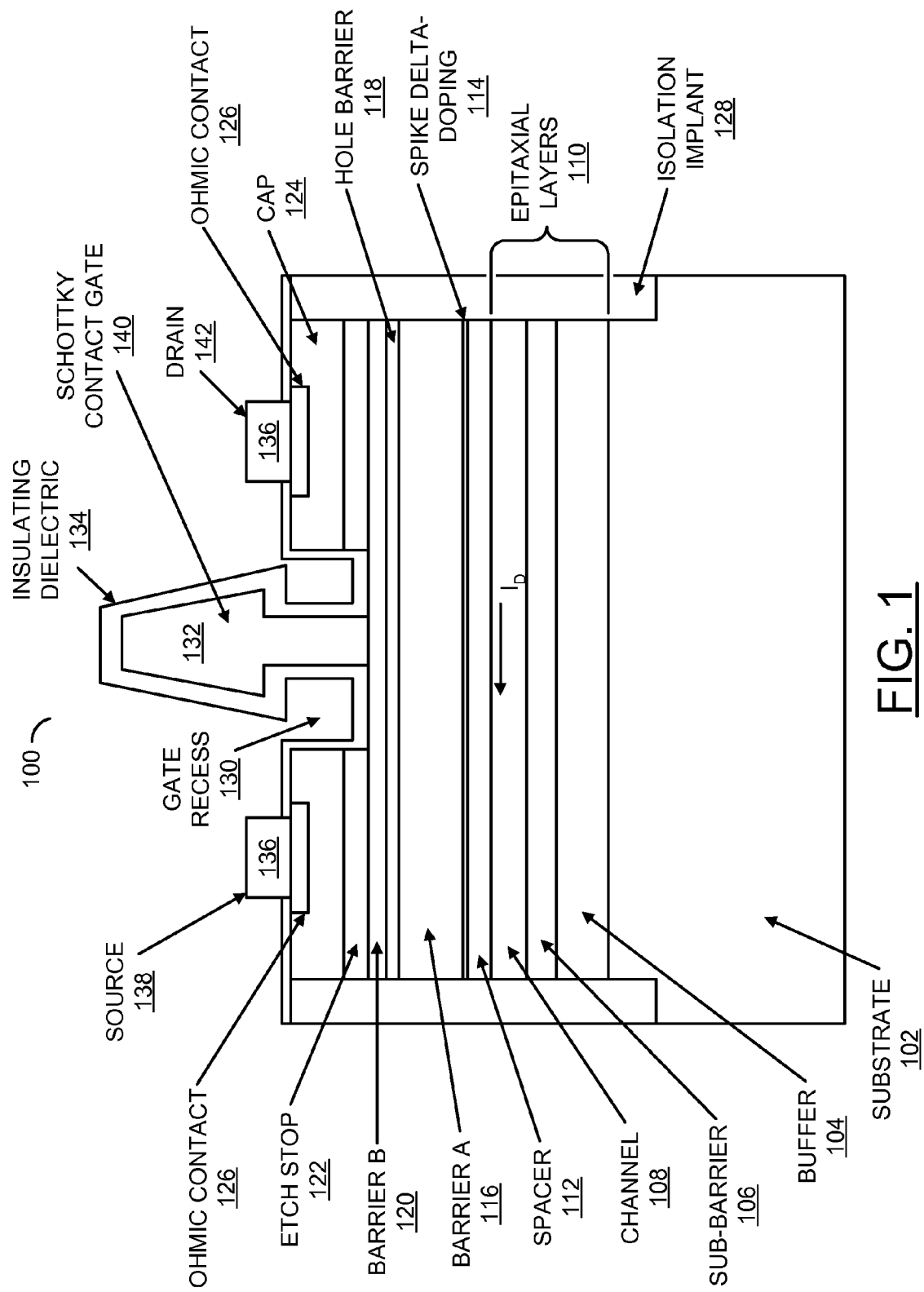
FIG. 1 is a cross-sectional diagram of an apparatus in accordance with a preferred embodiment of the present invention.

Referring to FIG. 1, a cross-sectional diagram of an embodiment of an apparatus 100 is shown in accordance with a preferred embodiment of the present invention. The apparatus (or device) 100 may implement a field effect transistor. The transistor 100 generally comprises a substrate (or base) 102, a layer (or region) 104, a layer (or region) 106, a layer (or region) 108, a layer (or region) 110, a layer (or region) 112, a layer (or region) 114, a layer (or region) 116, a layer (or region) 118, a layer (or region) 120, a layer (or region) 122, a layer (or region) 124, a layer (or region) 126, one or more zones (or volumes) 128, a recess (or cavity) 130, a layer (or region) 132, a layer (or region) 134, and a layer (or region) 136. The layers 104 to 108 may be referred to as epitaxial layers 110. The layer 136 may be patterned to create a source node (or contact) 138 and a drain node (or contact) 142 of the transistor 100. The layer 132 may be patterned to create a gate node (or contact) 140 of the transistor 100. The recess 130 may be formed in the layers 122 and 124, and may be referred to as a gate recess. The gate node 140 may be formed on the layer 120 within the gate recess 130.

The transistor 100 is generally configured as a depletion mode device. The transistor 100 may be normally "on" (e.g., a current $I_D$ flows between the drain 142 and the source 138) at no gate bias voltage and is driven "off" (e.g., the current $I_D$ is zero or near zero) by an application of a negative gate voltage relative to a source voltage.

In various embodiments, the transistor 100 may implement a pseudomorphic high electron mobility transistor (e.g., pHEMT). In some embodiments, the transistor 100 may implement a metal-semiconductor field effect transistor (e.g., MESFET). The transistor 100 may be designed with a single heterojunction in some embodiments. In other embodiments, the transistor 100 may be designed with multiple heterojunctions. Various designs of the transistor 100 may include, but are not limited to, a bulk doped device.

The layer 102 generally implements a substrate. The layer 102 may be formed with a Gallium Arsenide (e.g., GaAs) semiconductor. In some embodiments, the layer 102 may be a semi-insulating substrate. Other substrate materials and doping levels may be implemented to meet the criteria of a particular application.

The layer 104 generally implements a buffer layer. The layer 104 may be created from GaAs and formed on the layer 102. Other semiconductors may be implemented to meet the criteria of a particular application.

The layer 106 generally implements a sub-barrier layer. The layer 106 may be created from an Aluminum Gallium Arsenide (e.g., AlGaAs) semiconductor and formed on the layer 104. The layer 106 generally provides buffering between the crystal structure in the layer 104 and the crystal structure in the layer 108.

The layer 108 is generally referred to as a channel layer. The layer 108 may be created from an undoped Indium Gallium Arsenide (e.g., InGaAs) semiconductor and formed on the layer 106. A two-dimensional electron gas generally forms in the layer 108. The two-dimensional electron gas may provide conductivity (e.g., the current $I_D$) between the drain node 142 and the source node 138 in response to a voltage at the gate node 140. The lack of doping in the layer 108 may enable high mobility of the electrons in the two-dimensional gas by limiting coulombic interactions generally caused by the dopants. As such, the layer 108 may be referred to as a high mobility layer. The layer 108 may be fabricated with other materials to meet the criteria of a particular application.

The epitaxial layers 110 may be implemented as a combination of the layers 104 to 108. Other numbers and types of layers may be incorporated into the epitaxial layers 110 to meet the criteria of a particular application.

The layer 112 generally implements a spacer layer. The layer 112 may be formed of n-type $Al_XGa_{(1-X)}As$ on the layer 110 (e.g., the upper layer 108). The layer 112 may be an unintentionally doped layer. A doping concentration of the layer 112 generally ranges from at least $5\times10^{14}$ dopants (atoms) per centimeter cubed (e.g., $cm^3$) to around $5\times10^{16}$ dopants per $cm^3$ (e.g., an "n-" concentration).

The layer 114 generally implements a spike delta-doping layer. The layer 114 may be created from an n-type $Al_XGa_{(1-X)}As$ formed on the layer 112. The layer 114 may have a doping concentration of approximately $10^{12}$ to $10^{13}$ dopants per $cm^2$. Other doping concentrations may be implemented to meet the criteria of a particular application.

The layers 112/114 and 108 generally establish a heterojunction containing the two-dimensional electron gas in the layer 108. The higher conduction band (wider bandgap) of the layer 112 generally keeps the electrons in the relatively lower conduction band (narrower bandgap) of the layer 108. Electrons for the two-dimensional electron gas in the layer 108 may also be donated from the layers 112 and 114. The layer 112 may be fabricated with other high barrier semiconductor materials to meet the criteria of a particular application.

The layer 116 generally implements a barrier layer (e.g., barrier A). The layer 116 may be formed of n-type $Al_XGa_{(1-X)}As$ on the layer 114. The layer 116 may be an unintentionally doped layer. A doping concentration of the layer 116 generally ranges from at least $5\times10^{14}$ dopants per $cm^3$ to around $5\times10^{16}$ dopants per $cm^3$ (e.g., the "n-" concentration). Other doping levels may be implemented to meet the criteria of a particular application.

The layer 118 generally implements a hole barrier layer. The layer 118 may be formed of an n-type or p-type Indium Gallium Phosphide (e.g., InGaP) semiconductor on the layer 116. A doping concentration of the layer 118 may range from $5\times10^{16}$ dopants per $cm^3$ to $8\times10^{17}$ dopants per $cm^3$ (e.g., an "n" or "p" concentration). In various (e.g., lattice matched) embodiments, the layer 118 may have an $In_{(1-X)}Ga_XP$ (e.g., $In_{0.48}Ga_{0.52}P$) composition with the mole-fraction value X generally ranging from 30 percent to 70 percent. In other (e.g., pseudomorphic) embodiments, the mole fraction may also range from 30 percent to 70 percent to increase valence band discontinuity expected for mole fractions greater than the lattice matched cases. The layer 118 may be placed above the channel layer 108 and below the gate 140 in such a manner as to not degrade the transport characteristics of the channel layer 108 or a Schottky junction of the gate 140, typically in between the layers 116 and 118. The layer 118 may have a thickness ranging from a few (e.g., 5) Angstroms to several hundred (e.g., 300) micrometers to constitute a significant portion of the spacer and barrier layers (e.g., 112, 116 and 120).

A layer thickness (e.g., W) for a heteroepitaxy $In_{(1-X)}Ga_XP/Al_YGa_{(1-Y)}As$ layer may be determined by a Matthews-Blakeslee model per formula 1 as follows:

$$W = \frac{b(1 - v\cos^2\theta)}{8\pi\varepsilon(1 + v)\cos\lambda} \ln\left(\frac{\hbar}{b}\right) \quad (1)$$

where b may be a strength of a threading dislocation, v may be the Poisson's ratio, θ may be an angle between the Burgers vector and the length of an in-interface plane dislocation line, λ may be an angle between the Burgers vector and a direction in the interface that is perpendicular to the line of intersection of the slip plane and the interface, $h=h/2\pi$ may be the reduced Planck constant (or Dirac constant), and $\in$ may be a lattice mismatch strain. The lattice mismatch strain $\in$ may be calculated per formula 2 as follows:

$$\varepsilon = \frac{|\alpha_{InGaP} - \alpha_{AlGaAs}|}{\alpha_{AlGaAs}} \quad (2)$$

where α may be a lattice constant of the material. For an example case where b=4 Angstroms, v=0.33, cos θ=cos λ=0.5, and $\in$=0.01, the layer thickness W may be 60 Angstroms.

The layer 120 generally implements another barrier layer (e.g., barrier B). The layer 120 may be formed of n-type $Al_XGa_{(1-X)}As$ on the layer 118. The layer 120 may be an unintentionally doped layer. A doping concentration of the layer 120 generally ranges from at least $5\times10^{14}$ dopants per $cm^3$ to around $5\times10^{16}$ dopants per $cm^3$ (e.g., the "n-" concentration). Other doping levels may be implemented to meet the criteria of a particular application.

The layer 122 generally implements an etch-stop layer. The layer 122 may be formed on the layer 120. A composition of the layer 122 may be suitable to aid in controlling an etch depth of the recess 130 in the layer 124. In various embodiments, all of the layer 122 in the recess 130 may be removed. In other embodiments, some or all of the layer 124 in the recess 130 may remain after etching the layer 122.

The layer 124 generally implements a cap layer. The layer 124 may be created from n-type GaAs on the layer 122. A dopant concentration of the layer 124 may range from $10^{14}$ to $10^{19}$ dopants per $cm^3$ (e.g., the "n" and "n+" concentrations). Other dopant concentrations may be implemented to meet the criteria of a particular application.

The layer 126 generally implements an ohmic contact layer. The layer 126 may be created by sintering a metal into the layer 124. In some embodiments, the layer 126 may be created by diffusing additional dopants into the layer 124.

The zones 128 generally establish one or more isolation barriers. The zones 128 may be formed by ion implantations through the layers 104-124 and into the substrate 102. The implantations may be left un-annealed.

The recess 130 may implement the gate recess. The recess 130 may be created by etching through the layers 124 and 122 down to the layer 120. The gate recess 130 may separate the source node 138 from the drain node 142 of the transistor 100.

Figure 5:
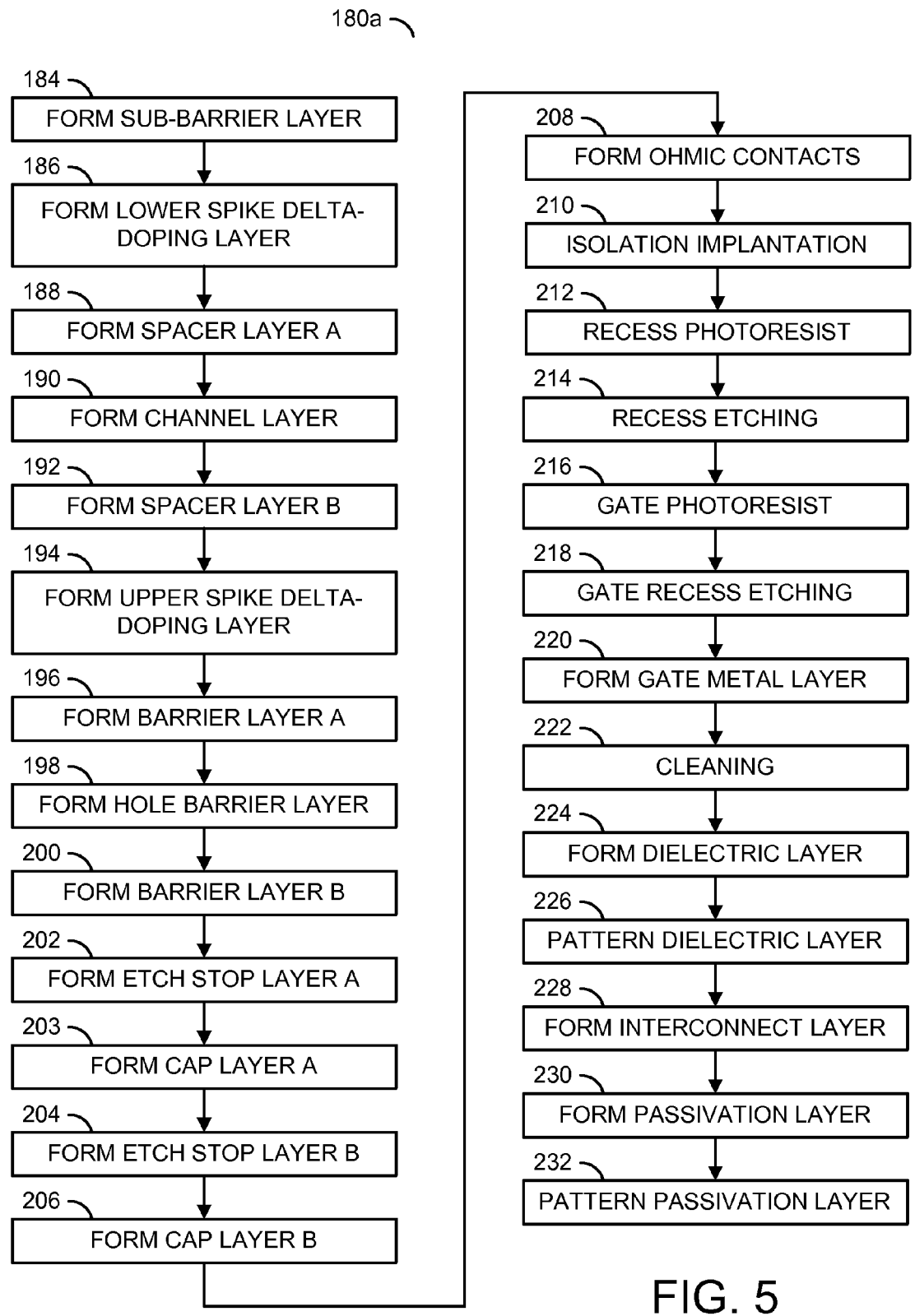
FIG. 5 is a flow diagram of another method for fabrication.

The layer 132 generally implements a conduction layer. The layer 132 may be created using one or more metals deposited on the layer 120. The layer 132 may be patterned to create the gate node 140 of the transistor 100. As illustrated, the deposition and patterning may create a trapezoidal-shaped (or T-shaped as shown in FIG. 5) gate 140. A Schottky diode may be formed between the bottom surface of the gate node 140 and a top surface of the layer 120. A variable depth diode depletion region may be created under the gate node 140 and generally extends into at least the layer 120. A voltage potential between the gate node 140 and the layer 120 may control the two-dimensional electron gas flowing in the layer 108 and thus the drain-to-source current $I_D$.

The layer 134 generally implements a passivation dielectric layer. The layer 134 may be created using plasma enhanced chemical vapor deposition (e.g., PECVD) deposited silicon nitride. The layer 134 may cover the recess 130. Other insulating materials may be used to meet the criteria of a particular application.

The layer 136 generally implements an interconnect layer. The layer 136 may be created using one or more metals on the contacts 126. The layer 136 may be patterned to define the source node 138 and the drain node 142 of the transistor 100.

Figure 2:
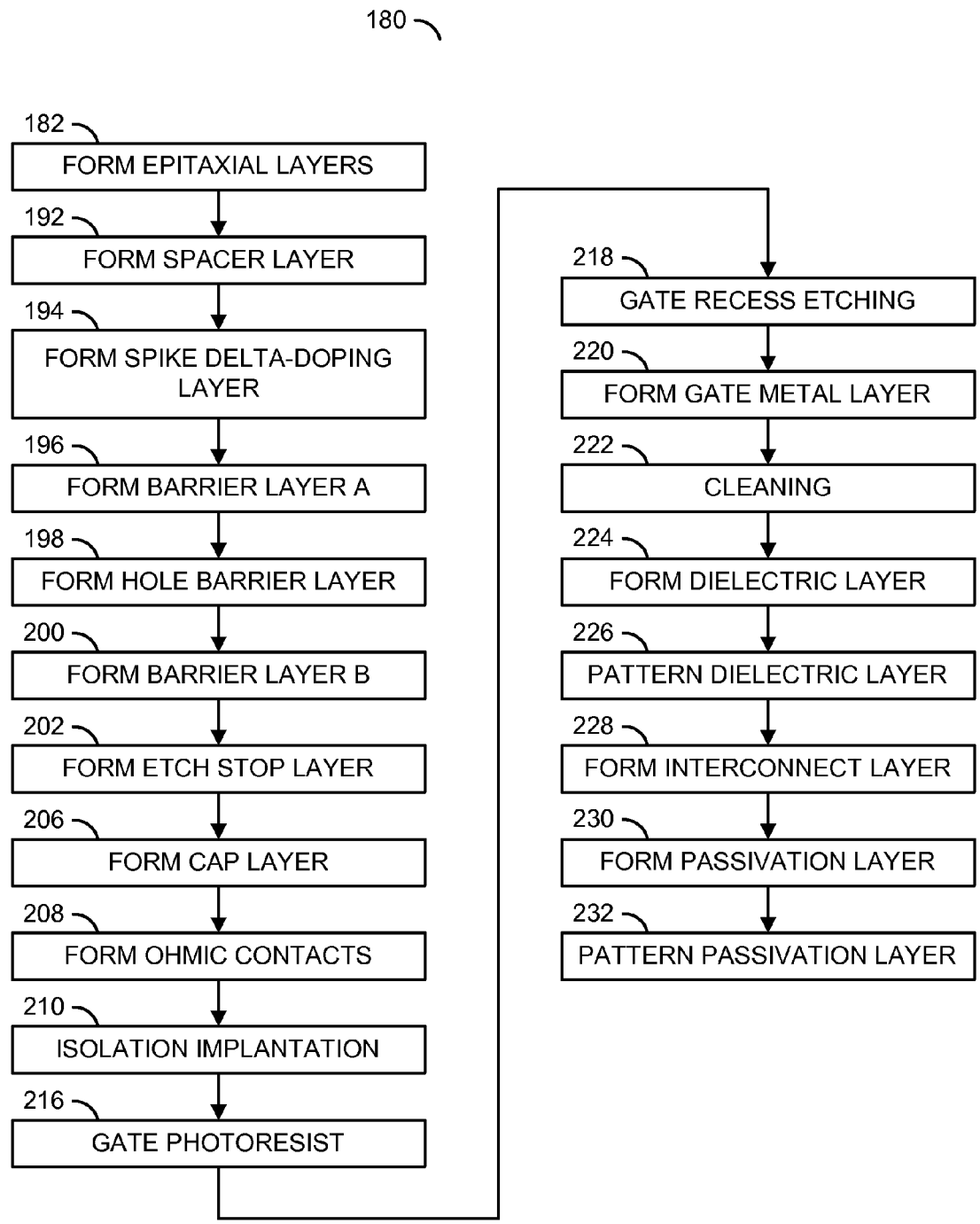
FIG. 2 is a flow diagram of a method for fabricating the apparatus.

Referring to FIG. 2, a flow diagram of a method 180 for fabricating the transistor 100 is shown. The method (or process) 180 generally comprises a step (or state) 182, a step (or state) 192, a step (or state) 194, a step (or state) 196, a step (or state) 198, a step (or state) 200, a step (or state) 202, a step (or state) 206, a step (or state) 208, a step (or state) 210, a step (or state) 216, a step (or state) 218, a step (or state) 220, a step (or state) 222, a step (or state) 224, a step (or state) 226, a step (or state) 228, a step (or state) 230, and a step (or state) 232. The sequence of the steps is shown as a representative example. Other step orders may be implemented to meet the criteria of a particular application. The method 180 may be performed in a normal semiconductor fabrication facility using normal fabrication techniques.

In the step 182, the epitaxial layer 110 may be formed on the substrate 102. The spacer layer 112 may be formed on the layer 110 in the step 192. The spike delta-doping layer 114 may be formed on the layer 112 in the step 194.

In the step 196, the barrier layer 116 may be created on the layer 114. The hole barrier layer 118 may be formed on the layer 116 in the step 198. The barrier layer 120 is generally formed on the layer 118 in the step 200. The etch-stop layer 122 may be formed on the layer 120 in the step 202. The cap layer 124 is generally created on the layer 122 in the step 206. The ohmic contacts 126 may be formed in the step 208. An isolation implantation may be performed in the step 210 to establish the zones 128 thereby electrically isolating the transistor 100 from neighboring devices.

A gate photoresist may be deposited and patterned in the step 216 to establish a shape of the gate node 140 or a portion of the gate node 140. In the step 218, the gate recess 130 may be created using the gate photoresist as a mask. In the step 220, the layer 132 may be deposited and patterned to build the gate node 140.

In the step 222, one or more cleaning processes may be performed to minimize surface states and electrical trap sites in a portion of the recess area 130 not occupied by the gate node 140. The cleaning may be performed after the gate metallization has been deposited and patterned and the photoresist stripped. In some embodiments, the cleaning may be achieved with a downstream plasma surface treatment utilizing energetic neutral oxygen molecules. In other embodiments, the cleaning may be achieved with a 10:1 $NH_4OH:H_2O$ wet clean followed by a spin dry.

The layer 134 may be deposited in the step 224 and patterned in the step 226. The layer 136 may be deposited and patterned in the step 228 to create the source node 138 and the drain node 142. In the step 230, a passivation layer may be deposited. Patterning of the passivation layer may be performed in the step 232. Additional processing steps, such as the deposition and patterning of additional conductive layers, etching vias, planarization steps and the formation of a top protection layer, may be performed to meet the criteria of a particular fabrication technology.

Figure 3:
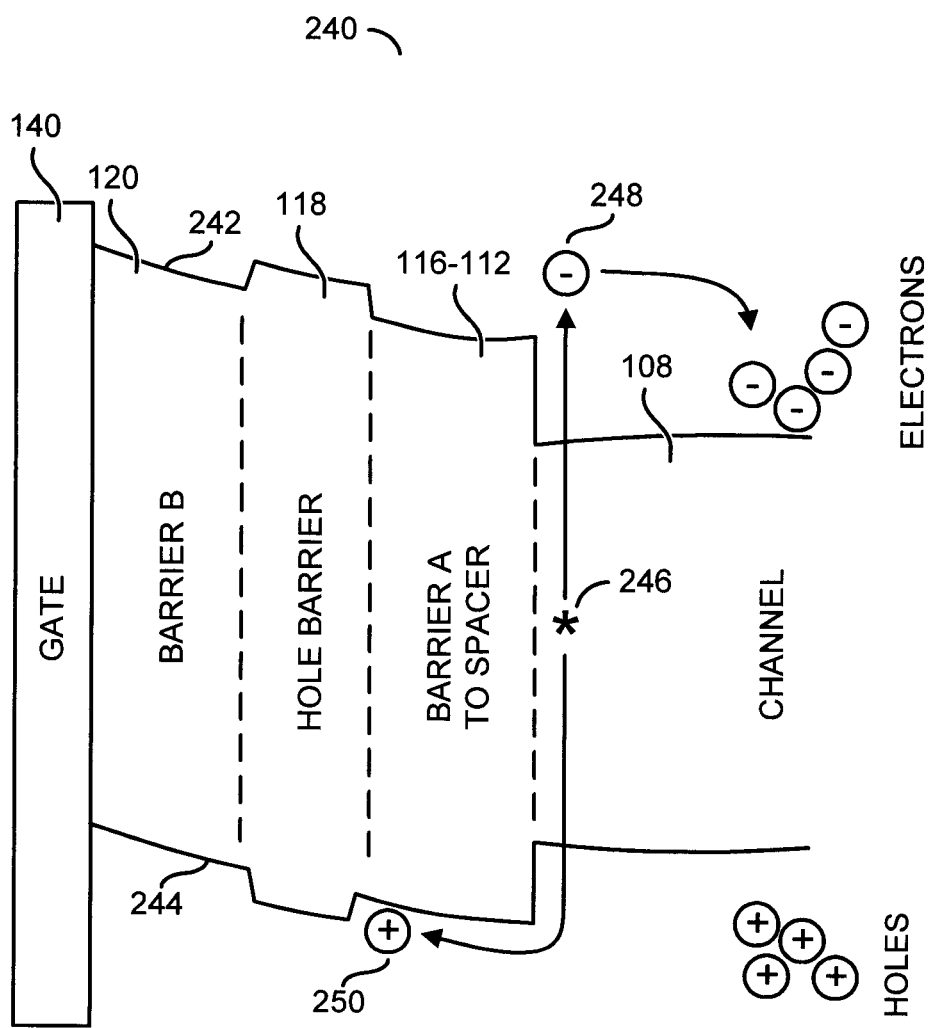
FIG. 3 is a diagram of energy bands of the apparatus.

Referring to FIG. 3, a diagram 240 of energy bands of the transistor 100 is shown. Electrons generally flow in a conduction band 242. Holes generally flow in a valence band 244. A bandgap (e.g., a separation between the conduction band 242 and the valence band 244) of the semiconductor material used to create the layers 120 and 116-112 may be uniform. The valence band 244 and the conduction band 242 are generally curved at equilibrium near the gate node 140. The curvature of the bands may be due to coincidence of Fermi levels of the semiconductor with the Fermi levels of the metal in the gate node 140. The semiconductor material used in the layer 108 generally has a narrower bandgap to establish a heterojunction containing the flow of electrons in the current $I_D$.

The hole barrier layer 118 may be created with a semiconductor material having a wider bandgap than the layers 120 and 116-112. The wider bandgap generally creates a barrier in the valence band 244 inhibiting the flow of holes toward the gate node 140. Extraneous electron-holes pairs 246 may be generated in one or more of the layers 108, 112 and/or 116 by impact ionization and/or band-to-band tunneling. The resulting electrons 248 may be carried toward and/or remain in the conduction band 242 of the layer 108. The resulting holes 250 may be carried toward the gate node 140 in the valence band 244. The extraneous electron-hole pair 246 generally adds to a gate leakage current of the transistor 100. By introducing the hole barrier created by the layer 118, flow of the extraneous holes 250 to the gate node 140 may be retarded and so the gate leakage current reduced (or suppressed).

Figure 4:
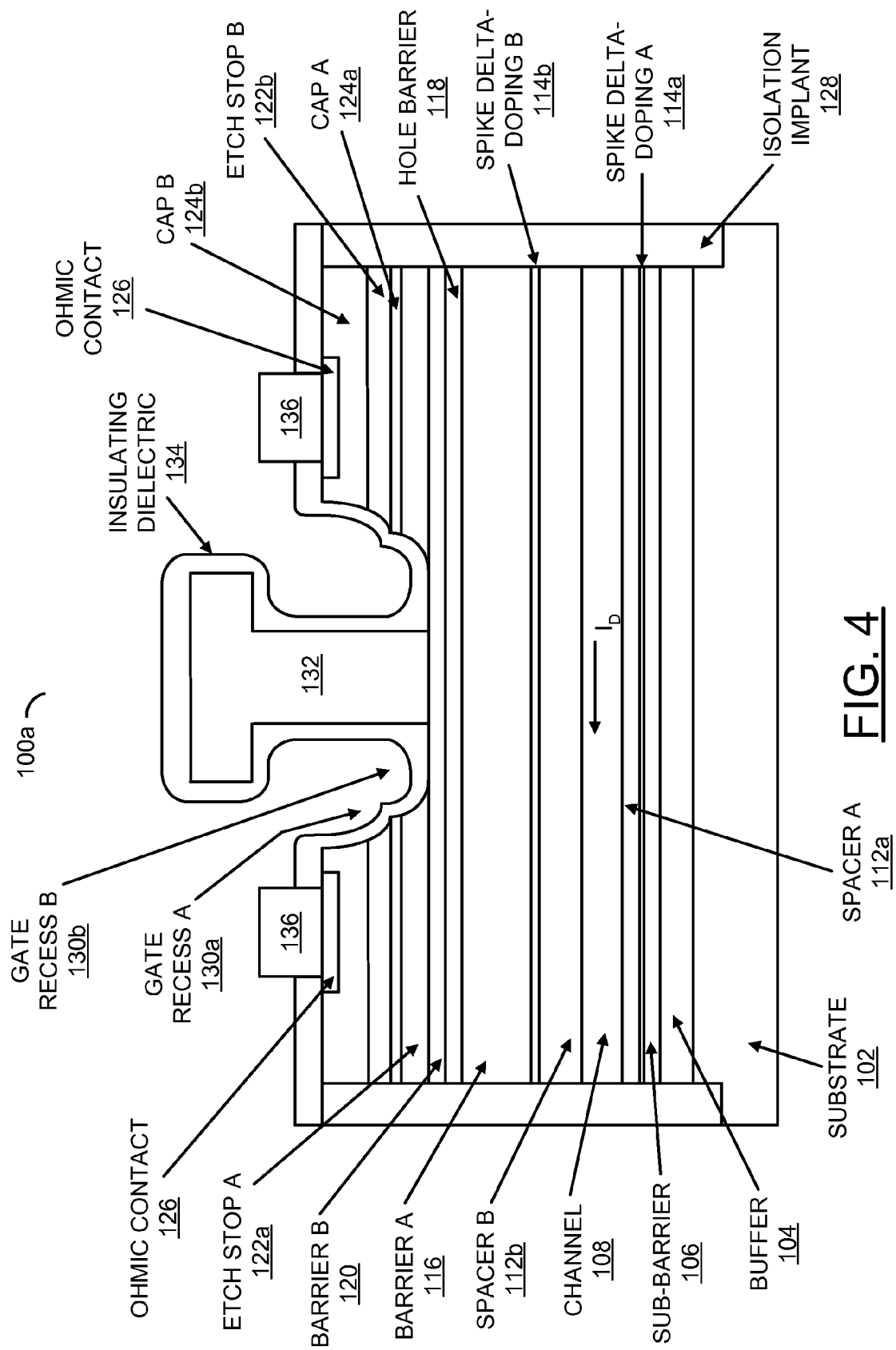
FIG. 4 is a cross-sectional diagram of another embodiment of the apparatus.

Referring to FIG. 4, a cross-sectional diagram of an example embodiment of an apparatus 100a is shown. The apparatus (or device) 100a may implement a variation of the transistor 100. The apparatus 100a generally comprises the substrate 102, the layer 104, the layer 106, the layer 108, the layer 110, the layer 112, the layer 116, the layer 118, the layer 120, the layer 122, the layer 124, the layer 126, the implantation zones 128, the layer 132, the layer 134 and the layer 136.

A design of the transistor 100a may be a variation of the transistor 100. Modifications, compared with the transistor 100, may be the formation of two spike delta-doping layers 114a and 114b, two spacer layers 112a and 112b, two etch stop layers 122a and 122b, and two cap layers 124a and 124b. The lower spike delta-doping layer 114a may be formed on the layer 106. The lower spacer layer 112a may be formed between the layer 114a and the layer 108. The upper spacer layer 112b and the upper spike delta-doping layer 114b generally reside in the same locations as the layers 112 and 114 in the transistor 100 shown in FIG. 1. The etch stop layer 122a generally resides in the same location as the layer 122. The layer 122b may be created on the layer 124a. The layer 124b may be created on the layer 122b. Another modification may occur in the etching of the layers 122 and 124. Two or more recess etchings may be performed to create recesses 130a and 130b instead of the single recess 130 shown in FIG. 1. Another modification may occur in the fabrication of the gate node 140 of the transistor 100a. A bottom half of the gate node 140 may be shaped by an initial gate photoresist deposition and patterning. A top half of the gate node 140 may be shaped by an additional gate photoresist deposition and patterning. A result may be the T-shaped gate node 140 instead of the trapezoid-shaped gate node 140 as shown in FIG. 1.

Referring to FIG. 5, a flow diagram of a method 180a for fabricating the transistor 100a is shown. The method (or process) 180a may be a variation of the method 180. The method 180a generally comprises a step (or state) 184, a step (or state) 186, a step (or state) 188, a step (or state) 190, the step 192, the step 194, the step 196, the step 198, the step 200, the step 202, a step (or state) 203, a step (or state) 204, the step 206, the step 208, the step 210, the step 212, the step 214, a step (or state) 216, a step (or state) 218, the step 220, the step 222, the step 224, the step 226, the step 228, the step 230, and the step 232. The sequence of the steps is shown as a representative example. Other step orders may be implemented to meet the criteria of a particular application. The method 180a may be performed in a normal semiconductor fabrication facility using normal fabrication techniques.

In the step 184, the sub-barrier layer 106 may be created on the layer 104. The spiked delta-doping layer 114a may be created in the step 186 on the layer 106. The spacer layer 112a may be formed on the layer 114a in the step 188. In the step 190, the layer 108 may be formed on the layer 112a.

The steps 192-202 of the method 180a may be similar to the same steps 192-202 of the method 180, with the layers 112, 114 and 122 being designated as the layers 112b, 114b and 122a, respectively. In the step 203, a cap layer 124a may be formed on the etch stop layer 122a. In the step 204, another etch stop layer 122b may be formed on the layer 124a.

The steps 206-210 of the method 180a may be similar to the same steps 206-210 of the method 180, with the layer 124 being designated as the layer 124b. A recess photoresist may be deposited and patterned in the step 212. In the step 214, an initial recess etch may be performed. The steps 216-232 of the method 180a may be similar to the same steps 216-232 of the method 180. The two recess etchings of the steps 214 and 218 resulting in the double-recess structure 130a-130b.

Figure 6:
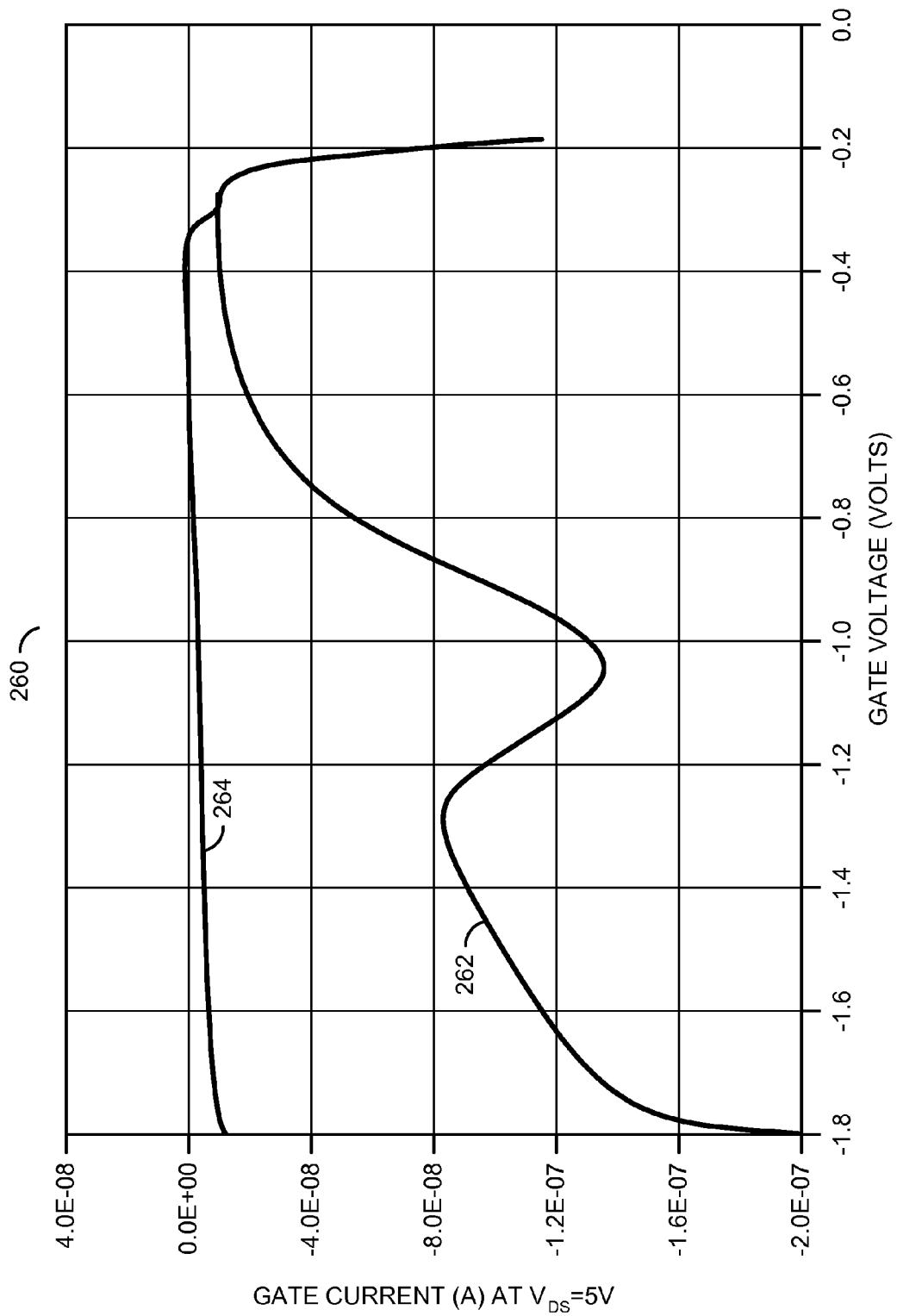
FIG. 6 is a graph comparing gate leakage currents as a function of gate voltage for a device with and without a hole barrier.

Referring to FIG. 6, a graph 260 comparing gate leakage currents as a function of gate voltage for a device with and without a hole barrier is shown. A curve 262 generally illustrates the gate leakage current of a common transistor without the hole barrier layer 118. A curve 264 generally illustrates the gate leakage current of a transistor with the hole barrier layer 118. The gate leakage current may be due to holes generated by impact ionization and/or band-to-band tunneling. The curve 264 may illustrate a suppressed gate leakage current (e.g., closer to zero amperes) compared with the curve 262 due to addition of layer 118 between gate node 140 (e.g., the Schottky contact) and the channel layer 108.

Various embodiments of the invention generally add little to no cost to the epitaxial materials as InGaP layers may already be included elsewhere in the structure. The inclusion of AlGaAs-based layers may serve a similar purpose. Dimensions of the layers may be controlled by precise epitaxial growth rather than by less controllable processing steps. The transistors 100 and/or 100a may be suitable for low-noise electronics applications. The transistors 100 and/or 100a may be applied to other applications to meet various design criterion.

The functions and structures illustrated in the diagrams of FIGS. 1-6 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example a non-transitory storage media, and may be executed by one or more of the processors.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a channel layer configured to carry a drain current in response to a voltage at a gate node;
a spacer layer in contact with said channel layer;
a doping layer in contact with said spacer layer;
a first layer in contact with said doping layer, wherein said first layer has a first bandgap;
a hole barrier layer in contact with said first layer, wherein said hole barrier layer has a second bandgap that (i) forms a valence band offset relative to said first bandgap, and (ii) is configured to impede holes generated in one or more of said channel layer and said first layer from reaching said gate node; and
a second layer in contact with said hole barrier layer, wherein (i) said second layer has said first bandgap, (ii) said gate node is in contact with said second layer and, (iii) said apparatus comprises a field effect transistor.

2. The apparatus according to claim 1, wherein said hole barrier layer comprises a III-V semiconductor.

3. The apparatus according to claim 1, wherein (i) said hole barrier layer comprises an $In_{(1-x)}Ga_xP$ semiconductor, and (ii) X ranges from approximately 0.3 to 0.7.

4. The apparatus according to claim 1, wherein said first layer and said second layer each comprise an AlGaAs semiconductor.

5. The apparatus according to claim 1, further comprising (i) an etch-stop layer in contact with said second layer, (ii) a cap layer in contact with said etch-stop layer, and (iii) a recess in both said cap layer and said etch-stop layer, wherein said gate node is disposed in said recess and on said second layer.

6. The apparatus according to claim 5, wherein said etch stop layer resides (i) between said second layer and a source node, and (ii) between said second layer and a drain node.

7. The apparatus according to claim 5, further comprising (i) an additional etch-stop layer in contact with said cap layer, (ii) an additional cap layer in contact with said additional etch-stop layer, and (iii) an additional recess in both said additional cap layer and said additional etch-stop layer overlapping said recess.

8. The apparatus according to claim 1, further comprising another doping layer.

9. The apparatus according to claim 1, wherein said field effect transistor comprises one of (i) a pseudomorphic high electron mobility transistor, and (ii) a metal-semiconductor transistor.

10. The apparatus according to claim 1, wherein said field effect transistor has a single heterojunction.

11. A method for fabricating a transistor, comprising the steps of:
    forming a channel layer configured to carry a drain current in response to a voltage at a gate node;
    forming a spacer layer in contact with said channel layer;
    forming a doping layer in contact with said spacer layer;
    forming a first layer in contact with said doping layer, wherein said first layer has a first bandgap;
    forming a hole barrier layer in contact with said first layer, wherein said hole barrier layer has a second bandgap that (i) forms a valence band offset relative to said first bandgap, and (ii) is configured to impede holes generated in one or more of said channel layer and said first layer from reaching said gate node;
    forming a second layer in contact with said hole barrier layer, wherein said second layer has said first bandgap; and
    forming said gate node in contact with said second layer, wherein said transistor comprises a field effect transistor.

12. The method according to claim 11, wherein said hole barrier layer comprises a III-V semiconductor.

13. The method according to claim 11, wherein (i) said hole barrier layer comprises an $In_{(1-x)}Ga_xP$ semiconductor, and (ii) X ranges from approximately 0.3 to 0.7.

14. The method according to claim 11, wherein said first layer and said second layer each comprise an AlGaAs semiconductor.

15. The method according to claim 11, further comprising the steps of:
    forming an etch-stop layer in contact with said second layer;
    forming a cap layer in contact with said etch-stop layer; and
    forming an additional recess in both said cap layer and said etch-stop layer, wherein said gate node is disposed in said recess and on said second layer.

16. The method according to claim 15, further comprising the steps of:
    forming an additional etch-stop layer in contact with said cap layer;
    forming an additional cap layer in contact with said additional etch-stop layer; and
    forming an additional recess in both said additional cap layer and said additional etch stop layer overlapping said recess.

17. The method according to claim 15, wherein said etch stop layer resides (i) between said second layer and a source node, and (ii) between said second layer and a drain node.

18. The method according to claim 11, further comprising the step of:
    forming another doping layer.

19. The method according to claim 11, wherein said field effect transistor comprises one of (i) a pseudomorphic high electron mobility transistor, and (ii) a metal-semiconductor transistor.

20. A field effect transistor fabricated in accordance with the method of claim 11.

* * * * *